United States Patent [19]

Loomis

[11] Patent Number: 5,458,269
[45] Date of Patent: Oct. 17, 1995

[54] FRANGIBLE SEMICONDUCTOR WAFER DICING METHOD WHICH EMPLOYS SCRIBING AND BREAKING

[76] Inventor: James W. Loomis, 1210 Church St., St. Helena, Calif. 94574

[21] Appl. No.: 377,484

[22] Filed: Jan. 24, 1995

Related U.S. Application Data

[63] Continuation of Ser. No. 110,178, Aug. 20, 1993, abandoned, which is a continuation-in-part of Ser. No. 804,135, Dec. 6, 1991, abandoned.

[51] Int. Cl.⁶ .................................................. B65H 35/10
[52] U.S. Cl. .............................. 225/2; 225/5; 225/96.5
[58] Field of Search ........................ 225/2, 4, 5, 96.5, 225/97, 103

[56] References Cited

U.S. PATENT DOCUMENTS

| | | | |
|---|---|---|---|
| 3,232,504 | 2/1966 | Ritter, Jr. et al. | 225/96.5 |
| 3,259,286 | 7/1966 | Le Gras | 225/2 |
| 3,491,929 | 1/1970 | Ueltz et al. | 225/4 |
| 3,593,899 | 7/1971 | DeTorre | 225/2 |
| 3,865,673 | 2/1975 | DeTorre | 225/2 |
| 4,018,372 | 4/1977 | Insolio | 225/2 |
| 4,049,167 | 9/1977 | Gulssard | 225/96.5 |
| 4,068,788 | 1/1978 | Gubitose et al. | 225/96.5 |
| 4,256,246 | 3/1981 | Kindel | 225/96.5 |

Primary Examiner—Kenneth E. Peterson
Attorney, Agent, or Firm—Howard L. Rose

[57] ABSTRACT

A method for applying a controlled, adjustable strain and strain rate by use of a break wheel to break a frangible semiconductor wafer around previously placed scribe lines formed along a surface of the wafer. Several embodiments of a break wheel are disclosed. One embodiment uses a pair of spaced profiles engageable on opposite sides of a scribe line on the wafer. Another embodiment uses three laterally spaced contact profiles, the center profile having a smaller radius than that of the two flanking contact profiles. Another embodiment uses a complaint break wheel for applying a resilient breaking force to the wafer in a region straddling the scribe line. All embodiments are used with a tilted surface having a break edge with which the scribe line is aligned prior to the application of the breaking force. The tilted surface is adjustable to provide a variable maximum strain limit.

19 Claims, 10 Drawing Sheets

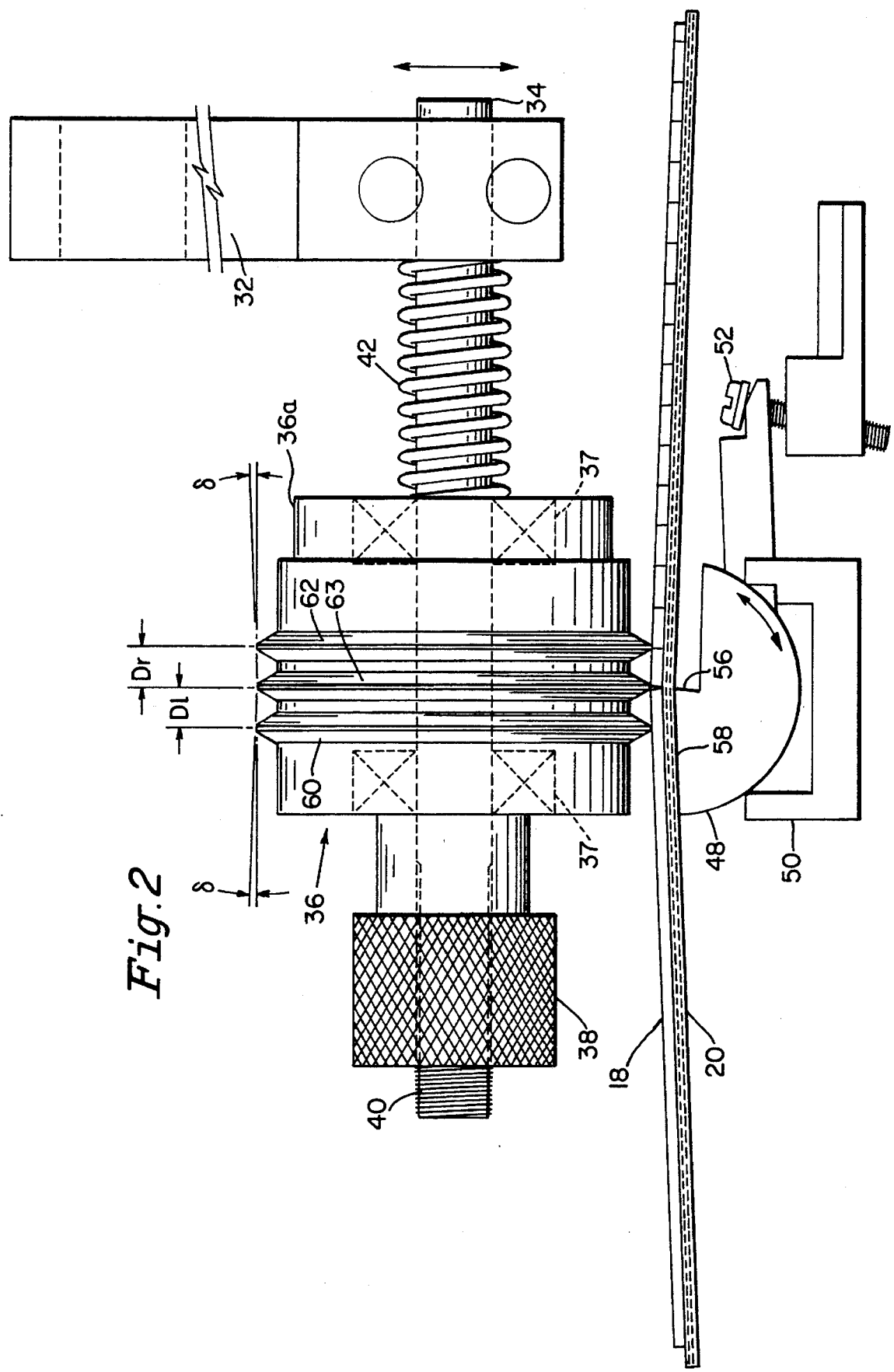

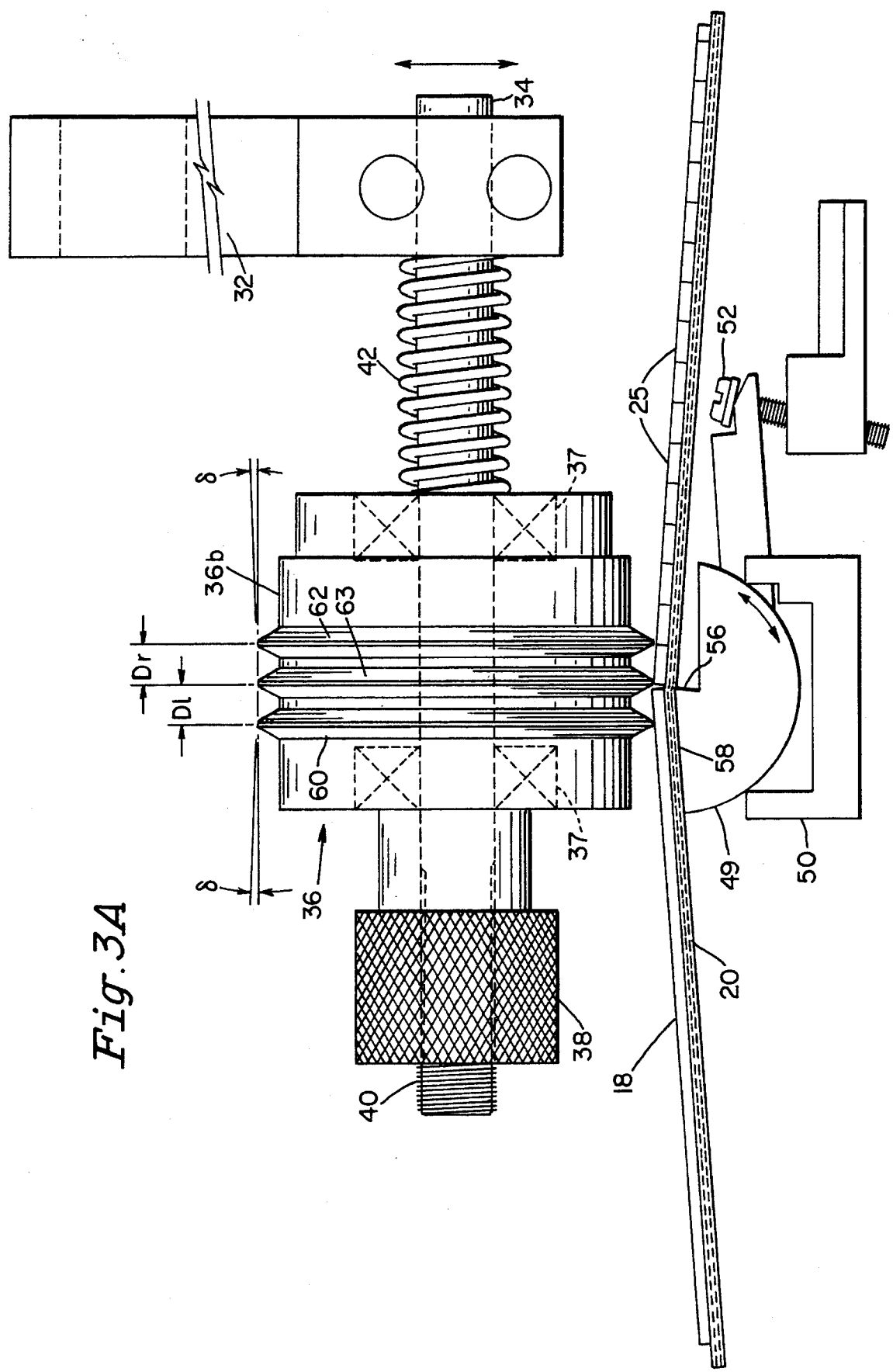

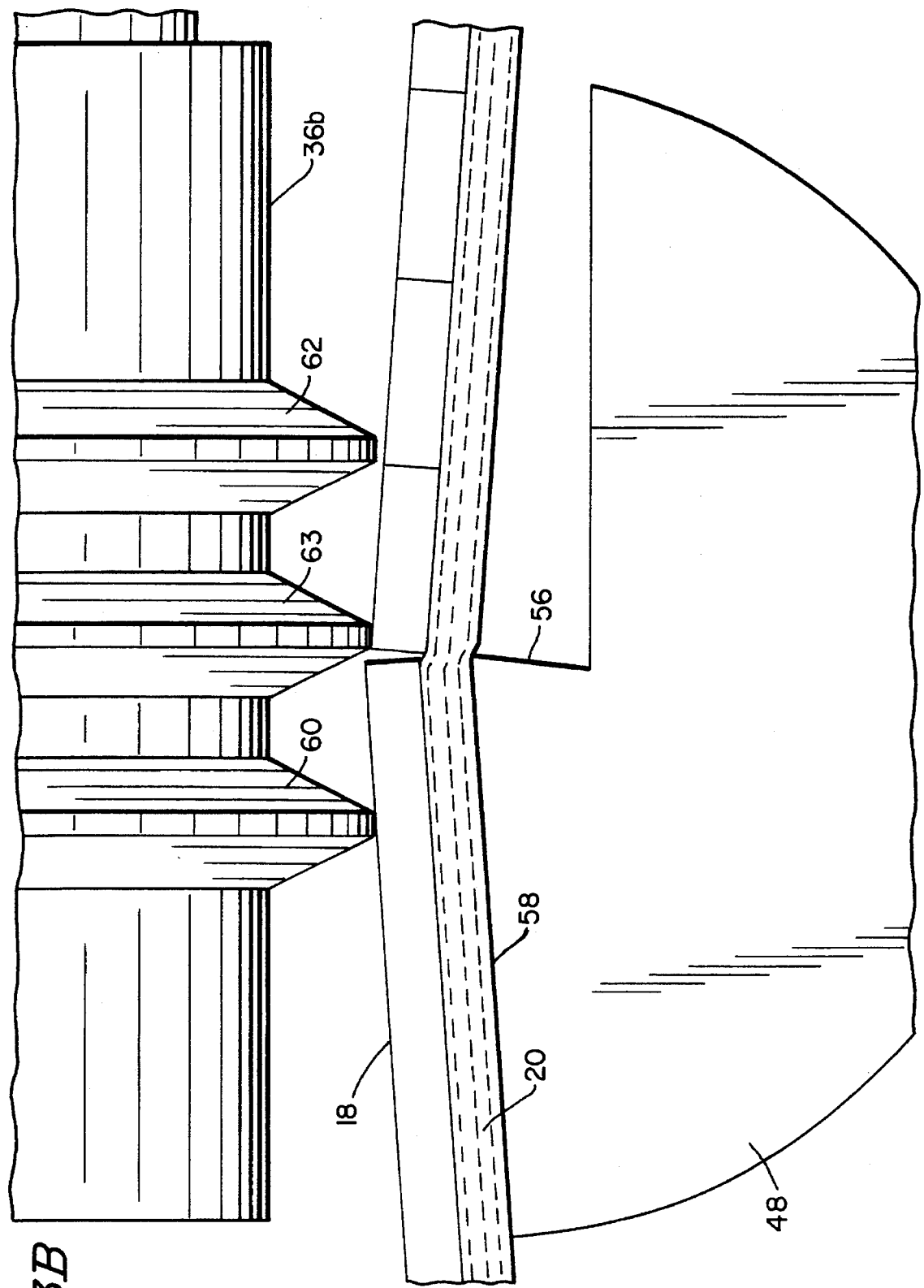

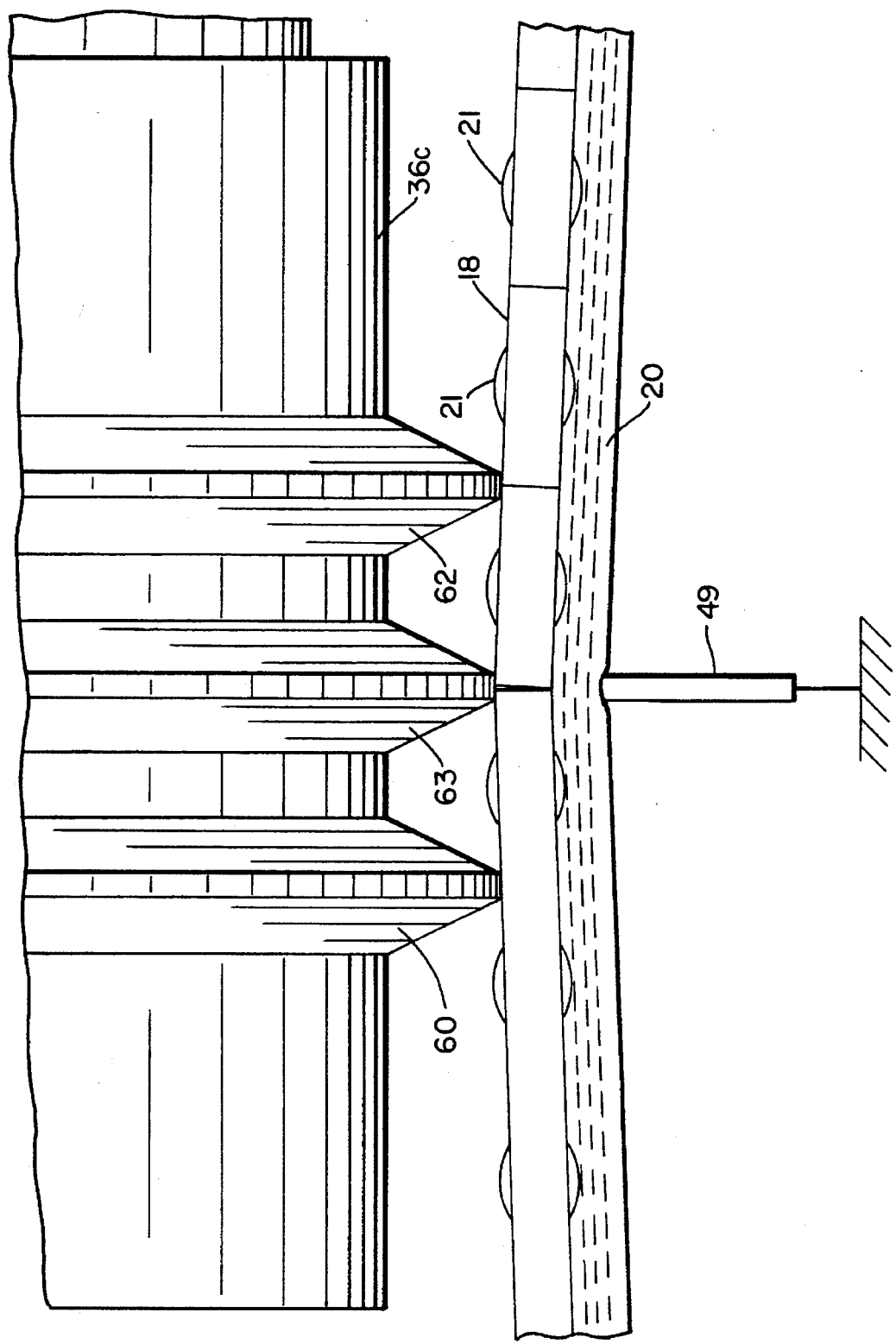

FRANGIBLE SEMICONDUCTOR WAFER DICING METHOD WHICH EMPLOYS SCRIBING AND BREAKING

CROSS REFERENCE TO RELATED APPLICATION

This is a continuation of application Ser. No. 08/110,178, filed on Aug. 20, 1993, now abandoned. which is a continuation-in-part of Ser. No. 07/804,135, filed Dec. 6, 1991, now abandoned entitled: "FRANGIBLE SEMICONDUCTOR WAFER DICING METHOD WHICH EMPLOYS SCRIBING AND BREAKING".

FIELD OF THE INVENTION

This invention relates to improvements in the handling of substrates which are easily broken and, more particularly, to apparatus and a method for scribing and breaking substrates such as semiconductor wafers, thin glass and the like.

BACKGROUND OF THE INVENTION

As is well known, semiconductor wafers are scribed along specific lines and thereafter separated along such lines to divide the wafer into semiconductor chips. Such division lines can be scribed with a diamond-pointed scribing tool or cut by a laser or saw. However, when the lines are scribed or partially cut, the wafer is not immediately separated into its individual pieces but must be broken after scribing has occurred.

Many attempts have been made to provide apparatus for breaking a semiconductor wafer into individual pieces with each piece representing a particular semiconductor chip. For the most part, these attempts have been unsatisfactory for one or more reasons. Specifically, the yield of a wafer using conventional techniques has been relatively low, and the loss of a large number of semiconductor chips from a given wafer represents a large loss in profits which could be realized if the yield were greater.

Breaking a scribe line is implemented by putting it in tensile strain. The point or bottom of the vertical crack under the scribe line will start experiencing molecular bond failures; slowly at first and increasing in an avalanche fashion. When the bond failure becomes quite rapid, the strain energy required to feed the failing is minuscule in relation to the tensile strength of the material. When the rapid bond failure initiates, it commonly starts at the edge of the wafer. The strain induced around the unbroken scribe line is released as the scribe line starts to fail and supplies the necessary energy to feed the break along the scribe line.

Until this invention, all known breaking methods and apparatus applied the tensile breaking strain in a mass fashion; e.g. causing the wafer to conform to a convex cylindrical section parallel to the scribe lines, or causing a single scribe line to bend about an edge in a guillotine fashion. All of these techniques attempt to break a scribe line instantly. Since scribe lines always break in a serial fashion from point A to point B, not instantaneously, the strain energy built up in the material affects the completion of the break. Usually, this residual strain energy is too much and ill-applied to achieve a perfect break. The excess applied strain contributes to chipping, edge degradation and skew (off scribe line) breaks.

Additionally, the traditional breaking methods always touch the entire surface of the wafer. With the introduction of "air-bridge" circuits (very thin micro-conductors, suspended over other conductors with the air space between acting as an insulator), breaking wafers has become more difficult because the air bridges are very fragile and must not be touched or contaminated during the breaking operation. Because of the drawbacks associated with conventional breaking techniques, a need has continued to exist for some time for an improved breaking apparatus and method to permit high yields yet provide for simplicity in operation without interference with the scribing step. The present invention satisfies this need because not only does it apply a limited (and adjustable) strain just necessary to drive the bond failures along the scribe line, but it also integrates breaking with scribing and thus can locate breaking forces outside the active circuit areas, which is normally the wafer separation grid area.

SUMMARY OF THE INVENTION

The present invention is directed to an apparatus and method for handling frangible substrates, such as semiconductor wafers, thin glass, etc., wherein a substrate can be scribed and immediately thereafter broken into rows of strips then subsequently scribed and broken into individual chips (or "die", the entire operation generally referred to as "scribing and dicing"). The scribing and breaking steps can be achieved while realizing high yield and provide for almost immediate breaking after scribing without interference with the scribing of the substrate.

To this end, the present invention provides the breaking of a substrate along the scribed lines on a substrate in a translating three-point beam bending system wherein beam bending forces are applied at two locations in a translating fashion on one side of the wafer and at a third point on the opposite side of the wafer between the first two points to permit the forces to be exerted on the substrate in breaking relationship thereto along the scribed lines.

The apparatus of the present invention further includes, in a preferred embodiment of the breaking means, a rotatable break wheel that is selectively engageable via its two profiles with the substrate on opposite sides of a line scribed by a scribing tool, the break wheel and tool being movable relative to the substrate preferably along straight lines. Thus, the wheel and tool can move relative to and along a surface of the substrate or, alternatively, the substrate can move while the wheel and tool remain stationary.

Version One:

In the breaking of the substrate, the break wheel profiles, when they engage one surface of the substrate, provide two of the three points of a three-point beam bending system relied upon in the present invention for breaking the substrate along a scribed line. The third point of the three-point beam bending mode is provided by a fixed abutment or support, preferably a mandrel, having an inclinable surface. The left wheel profile is positioned so it is incident on the portion of the substrate supported by the inclinable mandrel. The right wheel profile is positioned so it is incident on the cantilevered portion of the substrate. Since the downward travel of the break wheel is limited by the left profile engaging the supported portion of the wafer, the maximum strain induced around the unbroken portion of the scribe line is adjusted by changing the angle of the inclinable mandrel.

Version Two:

A second version of this breaking method uses a break wheel with three profiles. The center profile engages the substrate directly on the scribe line, the left and right profiles are positioned as in version one. The angle of the inclinable mandrel is set to the angle of the contact line of the left and center profiles. This angle is determined by the difference in diameter of the center and outer profiles of the break wheel, the center profile diameter always being less than either outer profile diameter. In this version of the invention, the downward travel of the break wheel is limited by the left and center profiles engaging the supported substrate. Therefore the maximum strain induced around the unbroken portion of the scribe line is limited by the contact line angles of the center and outer break wheel profiles built into the break wheel.

Version Three:

A third version of this breaking method uses a combination of the techniques used in versions one and two above. Again, a three profile break wheel is used as in version two, except that it is shifted slightly to the right, so that the center profile is just to the right of the inclinable mandrel, and it engages the substrate on the cantilevered portion of the substrate. As in version one, the left profile engages the unbroken substrate over the inclinable mandrel, thus limiting the break wheel's downward travel, so the angle of the mandrel sets the maximum strain induced around the unbroken scribe line.

As the substrate breaks along the scribe line, the center wheel profile pushes the newly broken portion of the substrate down, causing a shearing action to take place between the unbroken and newly broken portions of the substrate. This helps shear any backside metallization of the substrate. Other breaking techniques fail to address the issue of ductile, backside metallization, which generally leave the wafer in a condition where the chips are broken from each other, yet still attached via the backside metal (generally referred to as "gold hinge").

Version Four:

A fourth version of this breaking method is used where the separation grid of the substrate is not in the same plane of the rest of the substrate, as in wafers where large contact "bumps" are part of the active circuit area. Here the wheel setup is the same as in version two, with the center wheel profile engaging the substrate directly over the scribe line. The inclinable mandrel is replaced with a fixed narrow blade that fits between the bumps on the substrate.

Since the center wheel profile is limited in its downward travel by the substrate supported on the blade, the breaking strain is controlled by the contact angle between the center and outer profiles of the break wheel.

Version Five:

A fifth version of this breaking method uses a break wheel with a compliant outer surface. The break wheel has a relatively rigid mounting core structure, an intermediate compliant layer preferably fabricated from a foam material, and an outer sheath fabricated from a pliant material for retaining the intermediate layer on the core. In use, after the scribe line is formed, the wheel is lowered onto the top surface of the substrate with the compliant outer surface in contact with the top surface of the substrate in a region which straddles the scribe line. The wheel is manipulated along the scribe line to provide the tensile strain required to break the substrate along the scribe line.

The invention can form part of a wafer scribing and dicing machine which is conventional in construction. The scribing tool of such a machine reciprocates relative to the substrate to be scribed. The substrate is scribed as the scribe tool engages the substrate and moves in one direction. Then the tool is disengaged from the substrate, the break wheel engages the substrate and the wheel is moved to the opposite side of the wafer, separating the wafer along the scribed line. Then the wheel is disengaged from the substrate and the wafer is indexed laterally and incrementally while both scribe tool and break wheel are disengaged from the substrate.

The break wheel is mounted on an arm coupled to the machine and preferably movable with the scribe tool back and forth past a substrate to be scribed and broken. The drive means for moving the tool back and forth can also be the drive means for the arm carrying the wheel. The arm carrying the wheel is independently raised and lowered with respect to the scribe tool and is lifted from the substrate after a single pass of the wheel relative to the substrate in breaking relationship thereto. The wheel can move and operate with the mandrel as breaking means as a function of the motion of the scribe tool itself, or the break wheel can operate with the mandrel in a reciprocal fashion from the motion of the scribe tool.

The primary object of the present invention is to provide a substrate breaking apparatus and method suitable for use with a substrate scribing tool wherein the breaking means comprises a three-point beam bending system which serves to apply forces to a substrate scribed by the tool to break the substrate along the scribe lines thereof while the substrate is held, yet the substrate can be moved incrementally and transversely to the direction of movement of the scribe tool, whereby an entire substrate can be broken along a plurality of scribe lines to thereby simplify the division of the substrate into small pieces.

Another object of the present invention is to provide an apparatus and methods of the type described wherein the breaking of a substrate can be accomplished immediately after a scribe line has been formed in the substrate, whereby the present invention is suitable for scribing and breaking a semiconductor wafer into individual semiconductor chips.

Other objects of the present invention will become apparent as the following specification progresses, reference being had to the accompanying drawings for an illustration of the present invention.

BRIEF DESCRIPTION OF THE DRAWINGS

FIG. 2 is a front elevational view of three-profile break wheel engaging a substrate;

FIG. 3A is a front elevational view of three-profile break wheel with center profile shifted to the right;

FIG. 3B is a close-up of the view of FIG. 3A;

FIG. 4B is a close-up of the view of FIG. 4A;

DESCRIPTION OF THE PREFERRED EMBODIMENTS

Figure 5:
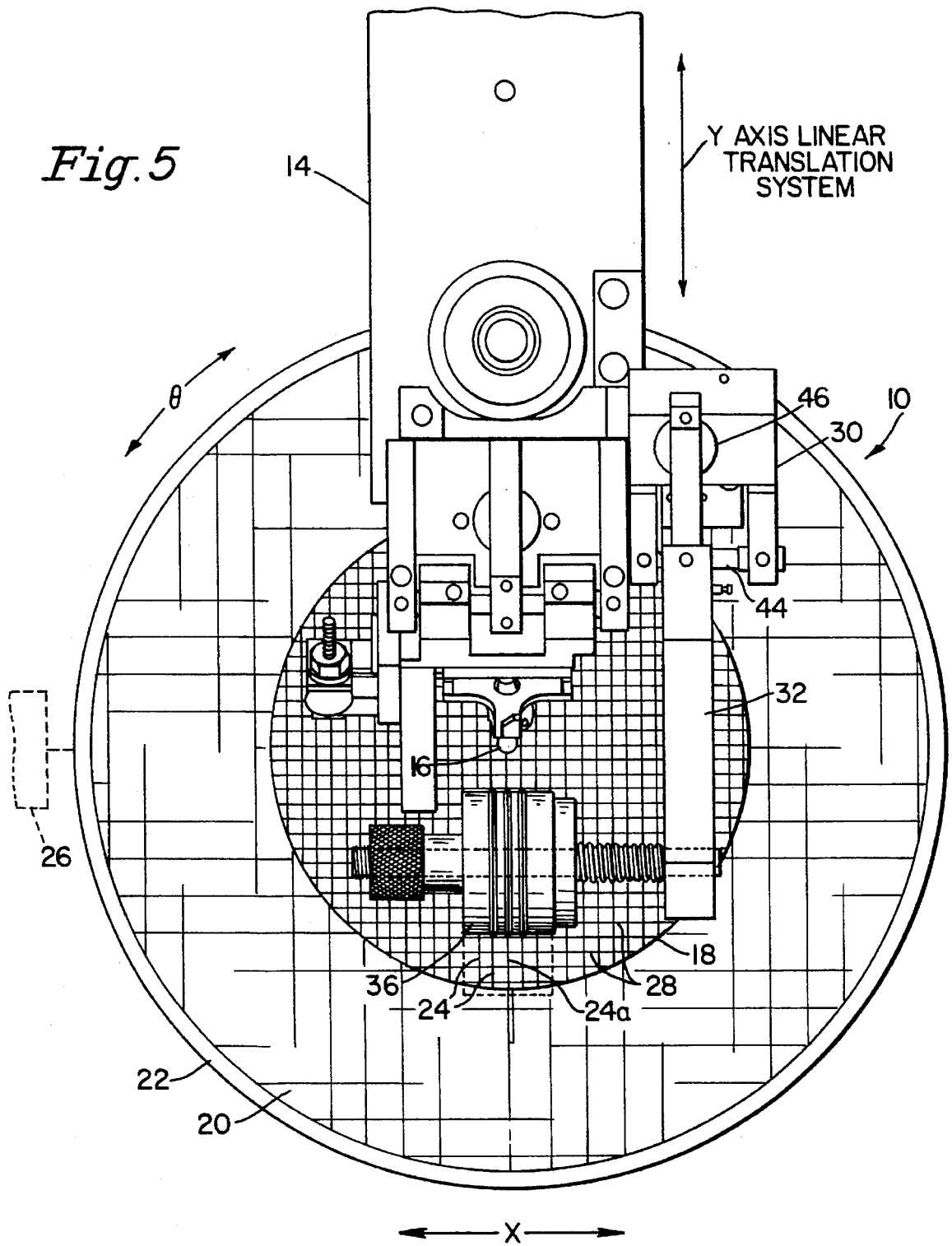
FIG. 5 is a top elevational view of the scribing machine and breaking means thereon, showing the relationship of x-axis (incremental motion of substrate) and y-axis (linear translation system for scribe tool and break wheel)
Figure 6:
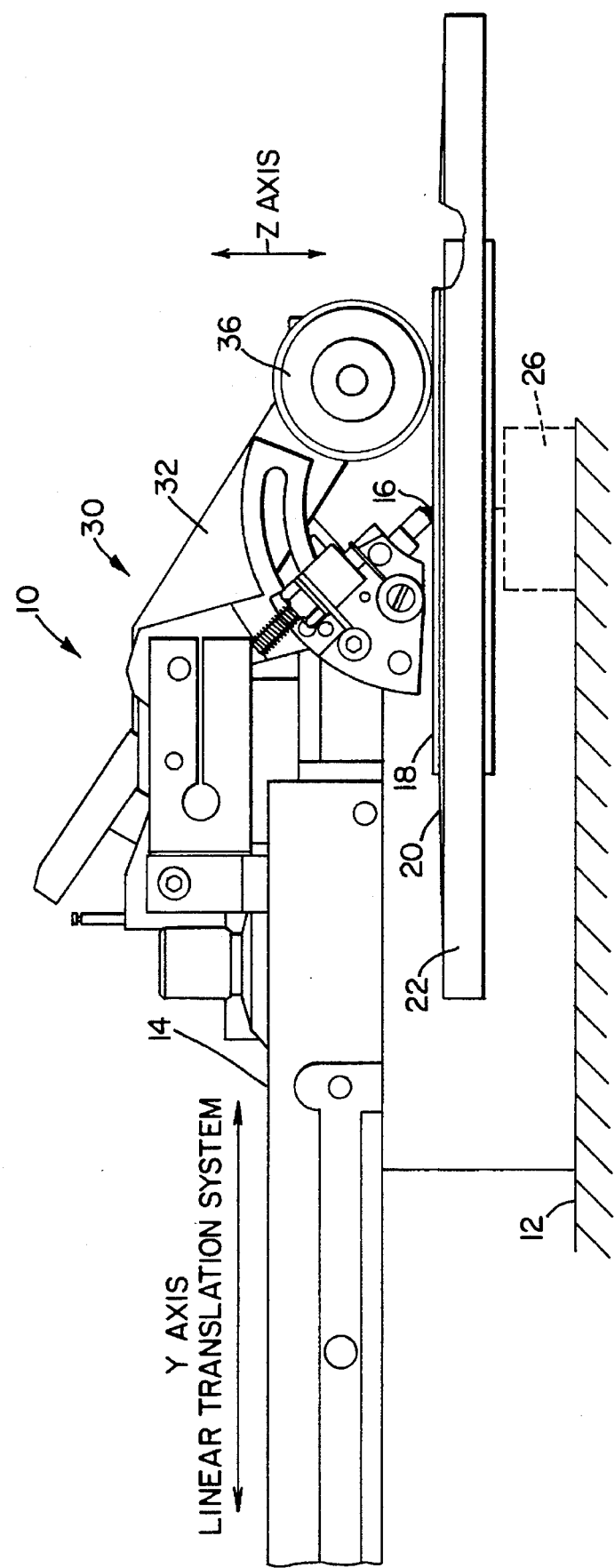
FIG. 6 is a side view of the scribing machine, showing relationship of the y-axis and the z-axis (independent raising and lowering of scribe tool) and the break wheel to engage a substrate.

The scribing and dicing apparatus of the present invention is broadly denoted by the numeral 10 and is shown in FIGS. 5 and 6. Apparatus 10 includes a base 12 for supporting a linear translation system 14 to which is coupled a scribe tool 16 for scribing a semiconductor or other wafer 18 mounted on a stretchable adhesive sheet 20 carried by a circular hoop or any other suitable conveyance mechanism 22 coupled in some suitable manner to base 12. The wafer 18 is adhesively bonded to the upper surface of the adhesive sheet 20, and the wafer is scribed by tool 16 as the tool moves under the influence of linear translation system 14 in one direction, such as to the left when viewing FIG. 6. As it moves to the left, the scribe tool scribes a line 24a (FIG. 5) as the tool 16 moves over the wafer 18 in one direction. After a line 24 has been scribed by the tool 16, the linear translation system 14 is caused to lift tool 16 above the wafer, then the tool is returned to its initial starting position or to the right when viewing FIG. 6 where the tool is in a position to scribe the next line. During a pause in the forward most travel to the right (when viewing FIG. 6) of the tool, the hoop 22 and sheet 20 are indexed by an indexing means 26 which will cause the sheet and hoop to incrementally move to the right when viewing FIG. 5 so as to position the tool 16 in a proper location for scribing the next scribe line 24.

The tool continues to scribe wafer 18 until all of the lines 24 parallel to line 24a shown in FIG. 5 have been scribed. After this has occurred, the hoop and sheet 20 and 22 are then rotated through an angle of 90° so that the wafer 18 will be in a position to be scribed by the tool along lines 28 which are perpendicular to lines 24.

The foregoing explanation relates to a scribing machine which is conventional in construction and operation. In the past, such a conventional machine was used merely to scribe a wafer, following which the scribed wafers would be removed from the machine and handled so as to separate the die or chips 25 formed by the formation of the perpendicular scribe lines 24 and 28 (FIG. 5). A typical scribing machine of conventional construction is one made and sold by Loomis Industries of St. Helena, Calif.

A breaking unit 30 is associated with the scribing part of apparatus 10 and unit 30 is provided to cause breaking of a column of chips on wafer 18 after a scribe line has been formed in the wafer. The breaking means cooperates with the stretchable adhesive sheet 20 which retains the chips on the sheet until the chips are removed one by one such as by a vacuum pick up device, where the chips are transferred to a point of use, such as another substrate for mounting a chip in a position to be wire bonded or the like.

Breaking unit 30 includes a break wheel arm 32 having a shaft 34 extending laterally therefrom. A break wheel 36 is mounted on the shaft and has bearings 37 mounting the wheel for rotation on shaft 34. The break wheel is held by a nut 38 threaded on the outer end 40 of the shaft 34, the nut bearing against the wheel for compressing a spring 42 which biases the wheel away from the break wheel arm 32. Several embodiments of wheel 36 are hereinafter described, the first embodiment being shown in FIG. 1 and other embodiments being shown in FIGS. 2, 3A, 4A, 7 and 8.

The break wheel arm 32 is pivotally mounted on an axle 44 (FIG. 5) for rotation about a generally horizontal axis, the axle being mounted on the linear translation system 14 in some suitable manner so that arm 32 can move up and down around the axle 44.

A fluid piston and cylinder actuator 46 (FIG. 5) is used to pivot the arm 32 in a counter-clockwise sense when viewing FIG. 6 so that the break wheel 36 (FIG. 1) can clear the wafer when the break wheel is to be returned to a starting position with respect to the scribe tool 16. As the arm 32 pivots upwardly with reference to FIG. 6, it carries break wheel 36 upwardly as well since the break wheel is mounted on the shaft 34.

Also associated with breaking means 30 is an elongated mandrel 48 which is rotatably carried by a bracket 50 coupled with base 12 in any suitable manner. An adjustment screw 52 permits the mandrel to be rotated about its central axis, said axis being defined by the edge 56 (FIG. 1) and being partially surrounded by the semicylindrical outer periphery 54 of the mandrel. A mandrel 48 has, adjacent to break edge 56, a break plane surface 58 which extends from the edge 56 to the outer periphery 54 as shown in FIG. 1.

Figure 1:
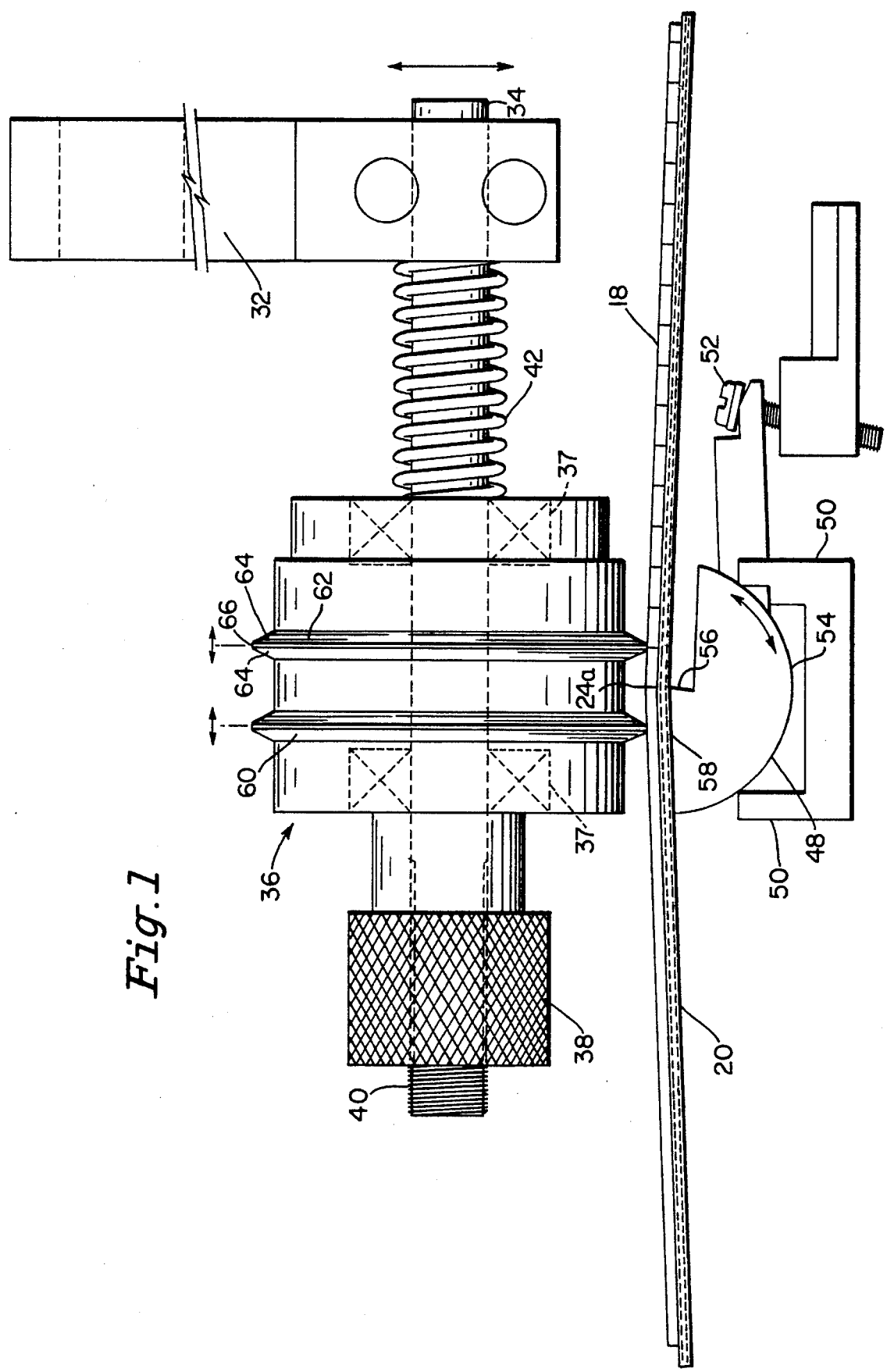
FIG. 1 is a front elevational view of two-profile break wheel engaging a substrate.

The mandrel break plane surface 58 normally engages the lower surface of sheet 20 and the wafer 18 rests on sheet 20 and is supported by the lower break plane surface 58 as shown in FIG. 1.

Break wheel 36 has a pair of wheel profiles or profile members 60 and 62, each having a pair of sides 64 which converge to an outer, flat end face 66 which engages the wafer 18. The left hand member 60 engages the wafer in the unscribed portion thereof on one side of a scribe line 24; whereas, the other or right hand member 62 engages the wafer over a scribe line 24. Depending upon the angle of plane surface 58, a greater or lesser amount of strain or downward force is applied to the wafer to break the wafer as the wheel rotates about the central axis of shaft 34.

In the first embodiment of the wheel as shown in FIG. 1, the break wheel profile members 60 and 62, when they engage the upper surface of the substrate provide two of the three points of a three-point beam bending system for breaking the substrate along a scribed line. The third point of the three-point beam bending mode is provided by mandrel 48, specifically surface 58 thereof which is inclined. The profile member 60 is positioned so that it is incident on the portion of the substrate supported by the surface 58 of mandrel 48. Since the downward travel of the break wheel is limited by the left profile member 60 engaging the supported portion of the wafer, the maximum strain induced around the unbroken portion of the scribed line is adjusted by changing the angle of the inclined surface 58. This is achieved by adjusting screw 52 or some other means for pivoting the mandrel 48 about its central axis relative to bracket 50.

In the use of the embodiment of FIG. 1, wafer 18 is held on the upper surface of adhesive sheet 20 in the manner shown in FIG. 1. Sheet 20 is held taut by hoop frame 22 (FIG. 6) and the sheet is mounted on the upper plane surface 58 of mandrel 48 (FIG. 1).

With wafer 18 aligned transversely along the x-axis (FIG. 5) and rotationally about the θ axis (FIG. 5), the separation grid channel and the most recent scribe line 24 are parallel and superimposed over break edge 56 of mandrel 48. The break edge 56 is at the center of rotation of mandrel 48 to assure break edge 56 will be stationary during adjustment of inclinable surface 58 by way of adjusting of screw 52.

As shown in FIG. 1, the last scribed line 24 extends longitudinally in the direction of movement of the break wheel 36. The traversing step is accomplished by actuating linear translation system 14 (FIG. 6) which conveys the scribe tool 16 and break wheel system 30 such that the line is scribed in the wafer by the tool 16 as the wheel is elevated above and spaced above the wafer during movement to the left when viewing FIG. 6.

Typically, the wheel is lowered onto the wafer when the wheel moves from left to right and as the tool also moves from left to right in an elevated position above the wafer. Thus, during the scribe operation, the breaking wheel is out of contact with the wafer; whereas, during the return of the tool in an elevated position to its starting position, the break wheel is lowered and engages the wafer for breaking the wafer along the previously formed scribe line 24 as the break wheel 36 moves from left to right when viewing FIG. 6.

In the FIG. 1 embodiment, tensile strain is created transversely across the scribe line 24 by pushing wafer 18 on opposite sides of scribe line 24 with break wheel profile members 60 and 62. Members 60 and 62 roll across the wafer parallel to the last scribe line 24 as the profiles are conveyed by the linear translation system 14, causing tensile strain across the scribe line to travel along the length of the scribe line 24.

The maximum tensile strain induced across the scribe line 24 is adjusted by changing the angle of break plane surface 58 of mandrel 48. When surface 58 is rotated counterclockwise around edge 56, wheel profile members 60 and 62 bend the wafer more about the scribe line 24 and thus induce more tensile strain across the scribe line 24 prior to the breaking of the scribe line 24. Conversely, the tensile strain is reduced when surface 58 is rotated clockwise around break edge 56 by screw 52. In effect, the maximum tensile strain is adjusted across scribe line 24 so that failure occurs along line 24 directly between the break wheel profile members 60 and 62 or a short distance in front of break wheel motion.

FIG. 2 shows another embodiment of the breaking wheel of the present invention, the break wheel being denoted by the numeral 36*a*. Wheel 36*a* differs from wheel 36 (FIG. 1) in that wheel 36*a* has three annular profile members 60, 62 and 63 associated with it, member 63 being between members 60 and 62. Again, a wafer 18 is mounted on the adhesive portion of sheet 20, and the sheet is held taut by hoop 22 (FIG. 6) and is held over mandrel 48.

Break edge 56 of mandrel 48 is at the center of rotation of the mandrel 48 to assure break edge 56 is stationary during adjustment of inclinable plane surface 58. Adjustment can be achieved by a screw such as screw 52 (FIG. 1).

The scribe line 24 traverses entirely a separation grid channel which is located over break edge 56 of the mandrel 48. The movement of the wheel 36*a* and wheel arm 32 is accomplished by linear translation system 14 (FIG. 6) which conveys scribe tool 16 and break wheel system 30 including arm 32.

Tensile strain is created transversely across the scribe line 24 by pushing wafer 18 on opposite sides of scribe 24 with break wheel profiles 60 and 62. Break wheel profile members 60 and 62 roll across the wafer 18 parallel to scribe line 24 as they are conveyed by the linear translation system 14 causing tensile strain across scribe line 24 to travel along the length of the scribe line 24.

Tensile strain is limited by the center profile member 63 of the wheel 36*a* and also by the left profile member 60 engaging the upper surface of the wafer 18 over break plane surface 58 of mandrel 48, thus limiting downward travel of break wheel 36*a*. The break plane surface 58 is equal to the angle $\delta$ which is the contact angle between the center profile member 63 and left profile member 60. The maximum tensile strain developed is a function of the angle $\delta$ which, in turn, is a function of the diameter of the center profile member 63 in relation to the diameters of outer profile members 60 and 62. The break wheel 36*a* is made so that the diameter of the left profile member 60 is equal to the diameter of center profile 63 plus 2Dl tan ($\delta$). The diameter of the right profile member 62 is equal to the diameter of the center profile member 63 plus 2Dr tan ($\delta$).

Angle $\delta$ is chosen so that failure occurs between break wheel profiles 60 and 62 or a short distance ahead of break wheel motion. Typically, the angle of break plane surface 58 is adjusted to equal angle $\delta$ so that the left wheel profile member 60 and center profile member 63 engage the substrate 18 simultaneously. If the surface break plane 58 is adjusted to an angle less than $\delta$ then the downward travel of the break wheel is limited only by left profile member 60, so that the maximum induced tensile strain across the scribe line 24 is reduced. If the surface break plane 58 is adjusted to more than angle $\delta$, then the downward travel of the break plane wheel is still limited by center profile member 63 so that the maximum induced tensile strain across scribe line 24 is still equal to the strain developed when surface break plane angle surface 58 is set to angle $\delta$.

FIGS. 3A and 3B show another form of break wheel 36*b* which is used if the back side or bottom side of wafer 18 has a coating of ductile metallization or the ductile material that does not break easily with the substrate, thereby making the substrate prone to "gold hinge". In such a case, the wheel 36*b* is used and such wheel uses a group of three profile members 60, 62 and 63, with the central profile member 63 being offset to the right of the break edge 56 of mandrel 48.

In using the embodiment of FIG. 3A, wafer 18 is again held on a stretchable sheet 20 as described above with the other embodiments. Sheet 20 is held taut by hoop frame 22 over mandrel 48.

Wafer 18 is aligned transversely along the x-axis (FIG. 5) and rotationally about the $\theta$ axis (FIG. 5) so that separation grid channel and the most recent scribe line 24 are parallel and superimposed over break edge 56 of mandrel 48. The break edge 56 is at the center of rotation of mandrel 48 to ensure break edge 56 is stationary during the adjustment of angle adjustment of the break plane surface 58 of the mandrel.

Scribed line 24 traverses entirely a separation grid channel which is located over break edge 56. The movement of the tool 16 is accomplished by linear translation system actuator 14 (FIGS. 5 and 6) which convey scribe tool 16 and break wheel system 30 to the left and then to the right when viewing FIG. 6.

Tensile strain is created transversely across scribe line 24 by pushing wafer 18 on opposite sides of scribe line 24 with break wheel profile members 60 and 62. Members 60 and 62 roll across wafer 18 parallel to scribe line 24 as they are conveyed by the translation system 14, causing tensile strain across the scribe line to travel along the length of scribe line 24.

The maximum tensile strain induced across the scribe line 24 is adjusted by changing the angle of the break plane surface 58 of the mandrel 48. When surface 58 is rotated counterclockwise around break edge 56, profile members 60 and 62 bend the wafer more about scribe line 24 and thus induce more tensile strain across the scribe line 24 prior to scribe line 24 breaking. Conversely, the tensile strain is reduced when break plane surface 58 is rotated clockwise around break edge 56.

The maximum tensile strain across scribe line 24 is adjusted so that failure occurs along scribe line 24 directly between break wheel profile members 60 and 62 or a short distance in front of break wheel motion. As the break occurs along the scribe line 24, the newly broken strips or dice 25 are pushed down by center profile 63, thus creating a shearing action between the newly broken strip or die 25 and the unbroken substrate 18. This shearing action cuts and separates the backside metallization directly under scribe line 24.

As in the first embodiment, the left profile member 60 of the embodiment of FIG. 3a engages the unbroken substrate 18 over the inclinable mandrel surface 58, thus limiting the break wheel downward travel so that the angle of the mandrel break plane surface 58 sets the maximum strain induced around the unbroken scribe line. As the substrate 18 breaks along the scribe line, the center wheel profile member 63 pushes the newly broken strip or die down, causing a shearing action to take place between the unbroken substrate 18 and newly broken portions 25. This helps to shear any backside metallization. Other breaking techniques fail to address the issue of ductile, backside metallization, which generally leaves the wafer in a condition where the chips are broken from each other yet still attached by a way of the backside metal, generally referred to as "gold hinge".

Figure 4A:
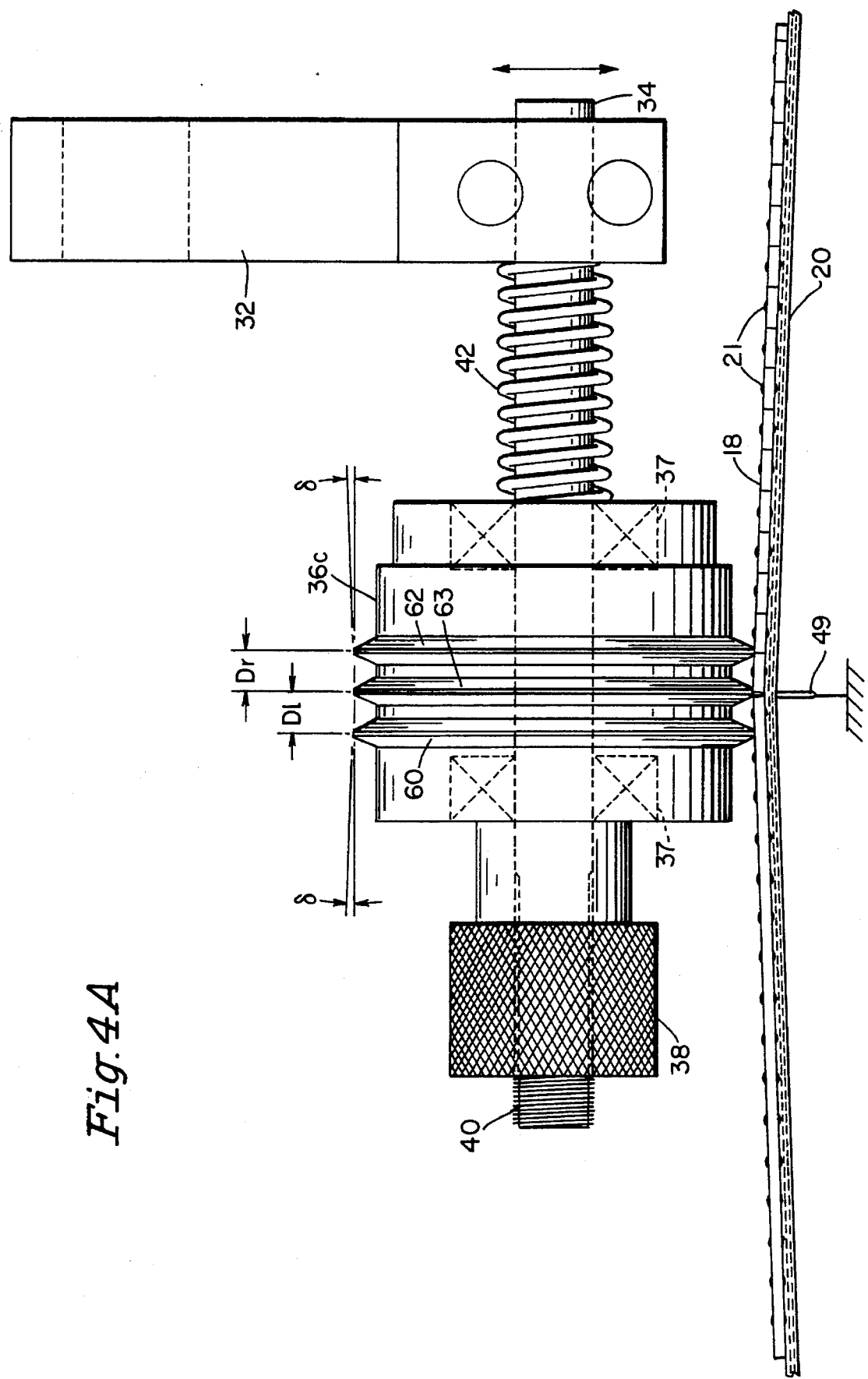
FIG. 4A is a front elevational view of three-profile break wheel with the inclinable mandrel replaced with a narrow blade.

In the fourth embodiment of the present invention as shown in FIGS. 4A and 4B, the separation grid of the substrate is not in the same plane as the rest of the substrate, as in wafers where large contact "bumps" are part of the active circuit area. In this embodiment, the breaking wheel 36c is the same as in the second embodiment with the center wheel profile member 63 engaging the substrate 18 directly over the scribe line 24. The mandrel 48 is replaced with a fixed narrow blade 49 which fits between the bumps on the substrate. Since the center wheel profile is limited in this downward travel by the substrate supported on the blade 49, the breaking strain is controlled by the contact angle between the center and outer profile members of the break wheel.

The substrate 18 is sometimes formed with relatively large contact bumps 21 in active circuit areas so that the separation grid is not in the same plane as the rest of the substrate. Typically, the substrate is not able to seat properly on break plane surface 58 of mandrel 48 due to the unevenness of the contact plane 21. In this case, a three profile break wheel is used as in the second embodiment except that the mandrel 48 in the second embodiment is replaced by a fixed narrow blade 49 in the fourth embodiment with the blade being operable to fit between the contact areas as shown in FIG. 4B.

In use, the fourth embodiment includes a wafer 18 held on a stretchable adhesive sheet 20. The sheet is held taut by hoop frame 22 over fixed narrow blade 49 as shown in FIG. 4A. Wafer 18 is aligned transversely along the x-axis (FIG. 5) and rotationally about the θ axis (FIG. 5) so that separation grid channel and most recent scribe line 24 are parallel and superimposed over fixed narrow blade 49.

The scribe line 24 traverses entirely a separation grid channel which is located over fixed narrow blade 49. The traversing operation is accomplished by linear actuator 14 which conveys the scribe tool 16 and break wheel system 30 in one direction over the substrate.

Tensile strain is created transversely across the scribe line by pushing wafer 18 on opposite sides of scribe line 24 with break wheel profiles 60 and 62. These two members 60 and 62 roll across wafer 18 parallel to scribe line 24 as they are conveyed by the translation system 14, causing tensile strain across scribe line 24 to travel along the length of scribe line 24.

Tensile strain is limited by a center profile 63 engaging wafer surface 18 over fixed narrow blade 49, thus limiting downward travel of break wheel 36c. The maximum tensile strain developed is a function of the angle δ which in turn is a function of the diameter of the center profile 63 in relation to the outer profile members 60 and 62. Break wheel 36c is made so that the diameter of the left profile member 60 is equal to the diameter of the center profile 63 plus 2 d1 tan (δ). The diameter of the right profile member is equal to the diameter of center profile member 63 plus 2 dr tan (δ). Angle δ is chosen so that the failure occurs between break wheel profile members 60 and 62 or a short distance ahead of break wheel motion.

Figure 7:
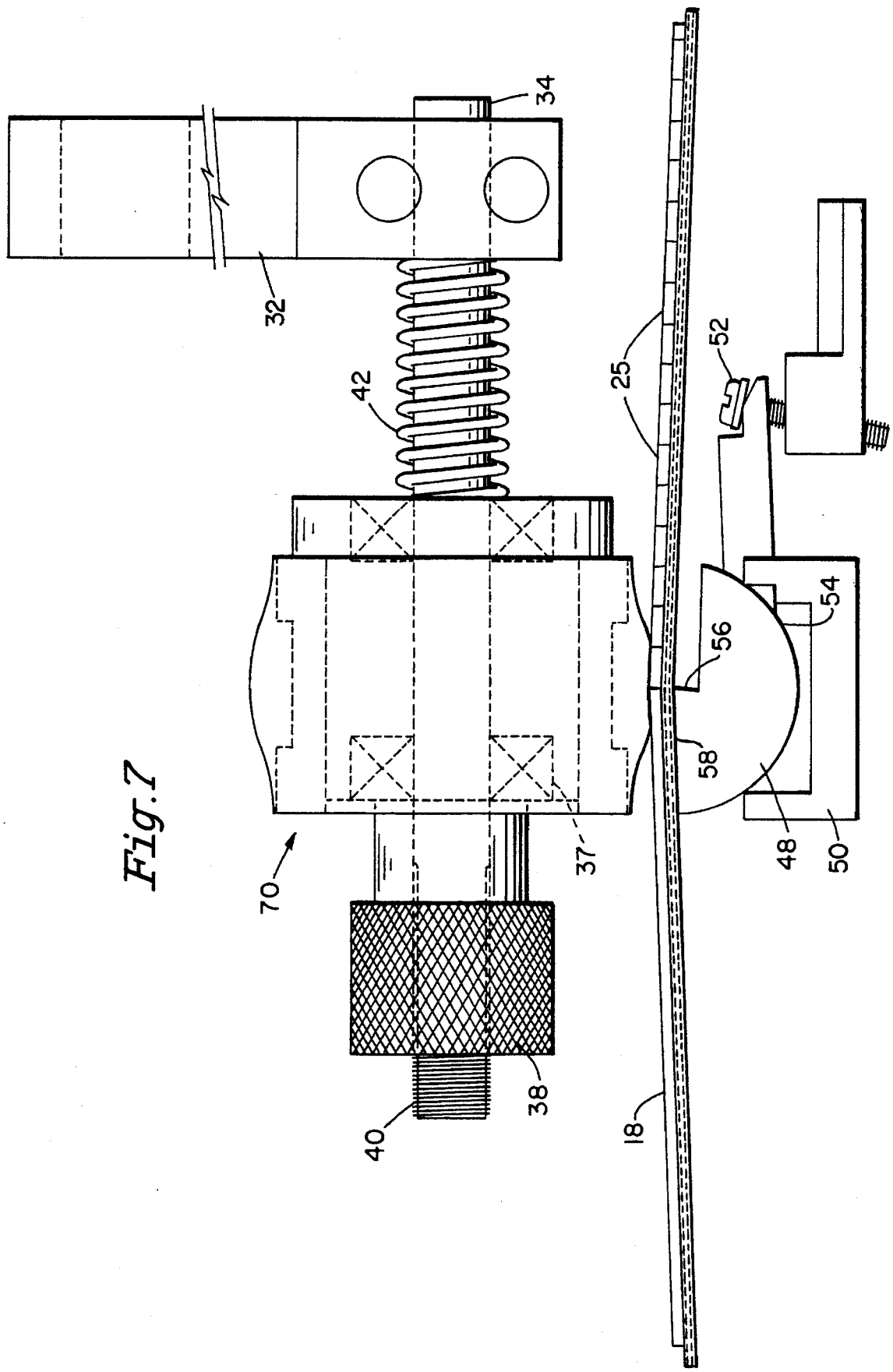
FIG. 7 is a front elevational view of a compliant break wheel engaging a substrate.
Figure 8:
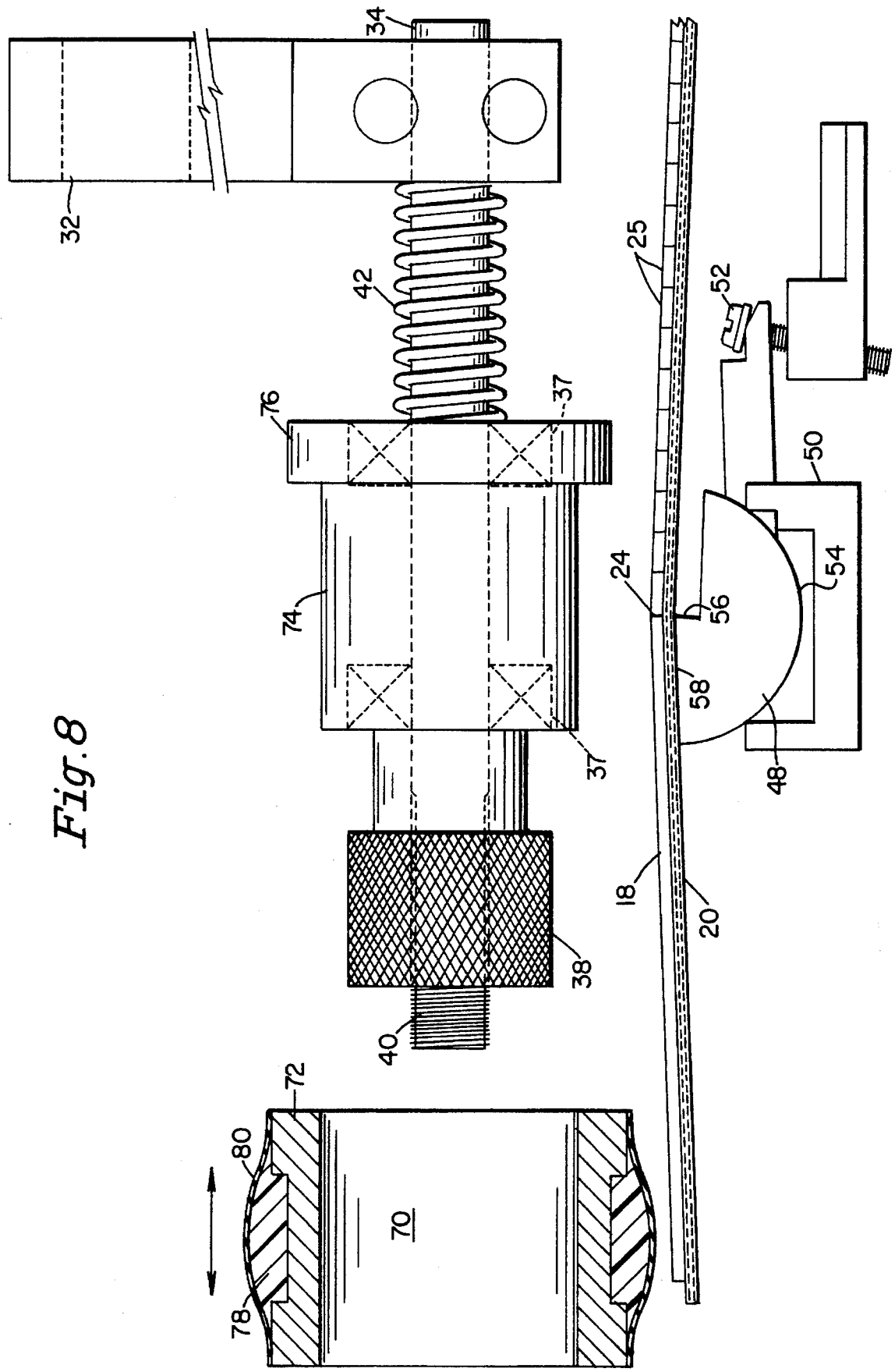
FIG. 8 is a view similar to FIG. 7 illustrating the compliant break wheel in section.

FIGS. 7 and 8 illustrate another embodiment of the invention employing a break wheel with a compliant surface for applying downward pressure on the top surface of the substrate over a region which encompasses the scribe line along which the wafer is to be broken. With reference to FIG. 7, a compliant break wheel 70 is arranged on shaft 34 and held in place in the same manner as the break wheels described above. As best shown in FIG. 8, break wheel 70 has a relatively rigid annular core member 72 with an inner diameter dimensioned to be snugly received about the outer diameter of the reduced diameter portion of wheel support 74. Core 72 is fabricated from a magnetizable material in the preferred embodiment, so that the wheel 70 is magnetically attracted to a magnetic flange portion 76 of support 74. Other mechanical mounting arrangements may be employed, as desired. A compliant layer 78 is attached to core 72, preferably by means of a pliant layer 80 of heat shrinkable tubing, which is shrink-fitted to the outer surface of core 72 at the ends thereof. In the alternative, pliant layer 80 may be adhered to the outer surface of core 72 by means of suitable adhesives. In addition to mounting layer 78 to core 72, pliant layer 80 provides a wear resistant surface for prolonging the useful life of layer 78.

Compliant layer 78 is fabricated from any one a number of compressible materials. In the preferred embodiment, layer 78 is fabricated from urethane material having a Shore A durometer hardness in the range from around 50–60. Other materials having a similar hardness characteristic, such as closed cell foam materials, may be employed depending on the requirements of a particular application. To facilitate mounting of the layer 78, the outer surface of annular core 72 is provided with a recess as illustrated in the Figs. Mounting arrangements with different contours are contemplated and are within the scope of the invention.

In use, with wheel 70 mounted in the manner illustrated in FIG. 7, the compliant outer surface is brought into contact with the substrate in the manner depicted by manipulating arm 32. The compliant surface presses downwardly on the top surface of the substrate 18 and provides the force required to break the substrate 18 along the scribe line. The downward force is distributed across the scribe line and over the area of contact between the surface of the wheel 70 and the substrate 18. The maximum tensile strain induced across the scribe line is adjusted by changing the angle of the break plane surface 58 of mandrel 48.

In all embodiments of the break wheel, nut 38 can be quickly moved on and off end 40 of shaft 34. This permits quick replacement of a break wheel with another break wheel to accommodate a particular type of wafer.

While the above provides a full and complete disclosure of the preferred embodiments of the invention, various modifications, alternate constructions and equivalents may be employed as desired. For example, while specific materials have been identified above with reference to the preferred embodiments of the invention described above, other equivalent materials may be employed, as desired. For example, a single layer of compliant material having the desired hardness and a wear resistant outer surface may be substituted for the foam layer 78 and pliant layer 80 in the embodiment of FIGS. 7 and 8. Therefore, the above description and illustrations should not be construed as limiting the invention, which is defined by the appended claims.

We claim:

1. A method of dividing a thin frangible substrate scribed along a scribe line, said method comprising the steps of:

providing a substantially flat tilted surface having a substantially straight break edge;

arranging the substrate over the tilted surface with the scribe line aligned with the break edge; and progressively applying a limited breaking force to the substrate laterally of the scribe line to fracture the substrate along the scribe line while limiting the maximum amount of strain imparted to the substrate to that permitted by the tilted surface, said step of progressively applying including the steps of providing a break wheel having three contact surfaces rotatable about an axis spaced from the substrate, and contacting the substrate with the contact surfaces by arranging one of the contact surfaces on one side of the scribe line over the tilted surface, another one of the contact surfaces on the other side of the scribe line, and the third one of the contact surfaces directly over the scribe line.

2. A method of dividing a thin frangible substrate scribed along a scribe line, said method comprising the steps of:

providing a substantially flat tiltable surface having a substantially straight break edge;

arranging the substrate to lie in contact with the break edge of the tiltable surface with the scribe line lying in the same flat plane with the break edge;

progressively applying breaking forces to the substrate along each scribe line in a bilateral fashion to the scribe line to fracture the substrate along the scribe line while limiting the amount of strain imparted to the substrate to that just necessary to drive breaking of the substrate long a scribe line; and determining the strain applied to that which causes the substrate to fail only where the scribe line exists by adjusting an angle of the tiltable surface relative to that applying the limited strain.

3. The method of claim 1 wherein said step of progressively applying includes the steps of providing a break wheel having a compliant surface and contacting the substrate with the compliant surface.

4. The method of claim 3 wherein the step of contacting is performed on a region of the substrate extending across the scribe line.

5. The method of claim 1 wherein said step of progressively applying includes the step of providing a break wheel having a plurality of spaced axially aligned contact surfaces rotatable about an axis spaced from the substrate, and contacting the substrate with the contact surfaces.

6. The method of claim 5 wherein the break wheel has a pair of contact surfaces; and wherein said step of contacting includes the step of arranging one of the contact surfaces on one side of the scribe line over the tilted surface and the other one of the contact surfaces on the other side of the scribe line.

7. The method of claim 1 wherein the substrate is scribed along a plurality of scribe lines; and wherein said steps of arranging and progressively applying are performed with reference to said plurality of scribe lines.

8. The method of claim 7 wherein the plurality of scribe lines includes a first group of parallel mutually spaced scribe lines and a second group of parallel mutually spaced scribe lines arranged at an angle to said first group; and wherein said steps of arranging and progressively applying are successively performed with reference to said first and second groups of scribe lines.

9. The method of claim 1 wherein said step of progressively applying is preceded by the step of forming the scribe line on the substrate.

10. The method of claim 9 wherein said step of progressively applying is followed by the steps of forming a second scribe line on the substrate, arranging the substrate over the tilted surface with the second scribe line aligned with the break edge of the tilted surface, and progressively applying a limited breaking force to the substrate laterally of the second scribe line to fracture the substrate along the second scribe line.

11. A method of dividing a thin frangible substrate scribed along a scribe line, said method comprising the steps of:

providing a substantially flat tilted surface having a substantially straight break edge;

arranging the substrate over the tilted surface with the scribe line aligned with the break edge; and progressively applying a limited breaking force to the substrate laterally of the scribe line to fracture the substrate along the scribe line while limiting the maximum amount of strain imparted to the substrate to that permitted by the tilted surface, said step of progressively applying including the steps of providing a break wheel having three contact surfaces rotatable about an axis spaced from the substrate, and contacting the substrate with the contact surfaces by arranging one of the contact surfaces on one side of the scribe line over the tilted surface and the other two of the contact surfaces on the other side of the scribe line.

12. A method of dividing a thin frangible substrate scribed along a scribe line, said method comprising the steps of:

providing a reference surface having a break edge;

arranging the substrate over the reference surface with the scribe line aligned with the break edge;

providing a break wheel having a plurality of axially aligned contact surfaces rotatable about an axis spaced from the reference surface, a central one of the contact surfaces being arranged between flanking ones of the contact surfaces, each flanking one of the contact surfaces being located a radial distance from the axis of the break wheel by a predetermined amount greater than the radial distance location of the central one of the contact surfaces; and progressively applying a limited breaking force to the substrate laterally of the scribe line to fracture the substrate along the scribe line by arranging the break wheel over the substrate with one of the flanking contact surfaces positioned laterally of the scribe line on one side thereof, and another one of the flanking contact surfaces positioned laterally of the scribe line on the other side thereof, and contacting the substrate with the contact surfaces.

13. The method of claim 12 wherein said step of progressively applying is followed by the steps of forming a second scribe line on the substrate, arranging the substrate over the reference surface with the second scribe line aligned with the break edge of the reference surface, and progressively applying a limited breaking force to the substrate laterally of the second scribe line to fracture the substrate along the second scribe line by arranging the break wheel over the substrate with one of the flanking contact surfaces positioned laterally of the second scribe line on one side thereof, and another one of the flanking contact surfaces positioned laterally of the second scribe line on the other side thereof, and contacting the substrate with the contact surfaces.

14. The method of claim 12 wherein said step of progressively applying includes the step of arranging the break wheel over the substrate with the central one of the contact surfaces directly over the scribe line.

15. The method of claim 12 wherein said step of progressively applying includes the step of arranging the break wheel over the substrate with the central one of the contact surfaces positioned adjacent the scribe line.

16. The method of claim 12 wherein the breaking force is limited by the difference in the radial extent of the flanking contact surfaces and the central contact surface of the breaking wheel.

17. The method of claim 12 wherein said step of progressively applying is preceded by the step of forming the scribe line on the substrate.

18. The method of claim 12 wherein the substrate is scribed along a plurality of scribe lines, and wherein said steps of arranging and progressively applying are performed with reference to said plurality of scribe lines.

19. The method of claim 18 wherein the plurality of scribe lines includes a first group of parallel mutually spaced scribe lines and a second group of parallel mutually spaced scribe lines arranged at an angle to said first group; and wherein said steps of arranging and progressively applying are successively performed with reference to said first and second groups of scribe lines.

* * * * *